United States Patent
Statter et al.

(10) Patent No.: US 12,299,357 B1
(45) Date of Patent: May 13, 2025

(54) METHOD FOR AUTOMATED TOPOLOGY RECOGNITION AND FUNCTIONAL ANNOTATION OF ANALOG/MIXED-SIGNAL CIRCUITS

(71) Applicant: Synopsys, Inc., Mountain View, CA (US)

(72) Inventors: Yishai Statter, Sharon, MA (US); Yan Zucker, Holon (IL)

(73) Assignee: Synopsys, Inc., Mountain View, CA (US)

(*) Notice: Subject to any disclaimer, the term of this patent is extended or adjusted under 35 U.S.C. 154(b) by 1013 days.

(21) Appl. No.: 17/246,380

(22) Filed: Apr. 30, 2021

Related U.S. Application Data

(60) Provisional application No. 63/019,114, filed on May 1, 2020, provisional application No. 63/019,120, filed on May 1, 2020.

(51) Int. Cl.
*G06F 30/18* (2020.01)
*G06F 30/20* (2020.01)

(52) U.S. Cl.
CPC .......... *G06F 30/18* (2020.01); *G06F 30/20* (2020.01)

(58) Field of Classification Search
CPC .......... G06F 30/18; G06F 30/20; G06F 30/12; G06F 2111/00; G06F 2119/22; G06F 30/25; G06F 30/27; G06F 30/28
See application file for complete search history.

(56) References Cited

U.S. PATENT DOCUMENTS

| | | | | |
|---|---|---|---|---|
| 5,086,477 A | * | 2/1992 | Yu | G06F 30/39 382/243 |
| 5,903,469 A | * | 5/1999 | Ho | G06F 30/398 716/115 |
| 7,418,683 B1 | * | 8/2008 | Sonnard | G06F 30/398 716/122 |
| 8,818,784 B1 | * | 8/2014 | Rubero | G06F 30/33 703/14 |
| 10,552,571 B2 | * | 2/2020 | Chan | G06F 30/17 |
| 2002/0046386 A1 | * | 4/2002 | Skoll | G06T 11/00 716/102 |

* cited by examiner

*Primary Examiner* — Kibrom K Gebresilassie
(74) *Attorney, Agent, or Firm* — Lowenstein Sandler LLP

(57) ABSTRACT

A system and method for automated topology recognition and functional annotation of a mixed-signal circuit is disclosed. The method includes extracting structural information available from the mixed-signal circuit. The method includes identifying functionality of a sub-circuit of the mixed-signal circuit based on the extracted structural information by comparing the sub-circuit with a library cell. The method includes annotating the extracted structural information with the identified functionality corresponding to the sub-circuit. The method includes automatically generating a plurality of configurations corresponding to the annotated structural information.

20 Claims, 9 Drawing Sheets

```
.subckt diff_pair# bias_in signal_in1 signal_in2 signal_out
*> npsym
m# hub bias_in gnd gnd nmos
m# signal_out signal_in2 hub gnd nmos
m# 1 signal_in1 hub gnd nmos
m# 1 1 vdd vdd pmos
m# signal_out 1 vdd vdd pmos
.ends
```

METHOD FOR AUTOMATED TOPOLOGY RECOGNITION AND FUNCTIONAL ANNOTATION OF ANALOG/MIXED-SIGNAL CIRCUITS

RELATED APPLICATIONS

The present application claims the benefit of U.S. Provisional Patent Application No. 63/019,120, entitled "Method for Automating Behavioral Modeling of Mixed-Signal Circuit," filed on May 1, 2020, and of U.S. Provisional Patent Application No. 63/019,114, entitled "Non-Spectral Canonical Labeling Method for Analog Circuit Recognition," filed on May 1, 2020, which are incorporated herein by reference in their entirety for all purposes.

STATEMENT UNDER MPEP § 310 REGARDING U.S. FEDERAL GOVERNMENT SPONSORED RESEARCH OR DEVELOPMENT

This invention was made with government support awarded by the United States (U.S.) Defense Advanced Research Projects Activity (DARPA). By way of a paid-up license, the U.S. government has certain rights to the invention(s) claimed herein. More specifically, the U.S. government may, in limited circumstances, require the patent owner to license technology covered by this patent to others on reasonable terms as provided by the terms of Contract No. HR0011-18-9-0008 awarded by DARPA.

TECHNICAL FIELD

This disclosure relates to the field of electronic design automation in general, including the following topics: automatic behavioral modeling of a mixed-signal circuit, circuit recognition, circuit modeling, and non-spectral canonical labeling methods for analog circuit recognition.

BACKGROUND

Circuit modeling techniques are as diverse as circuit types themselves. Currently available automatic circuit modeling tools focus on niche circuits, such as amplifiers or oscillators. They do not offer a solution for a mixed-signal circuit, i.e., a circuit that includes both an analog circuit and a digital logic or circuit or an analog circuit embedded in digital logic or circuit. The main challenge to automating the mixed-signal system and diverse design modeling is the complexity of user input required. Configuration of hypothetical tool to produce a behavioral model of the mixed-signal circuit requires manual partitioning of sub-circuits, input and output nets, digital and analog signals, and further definitions and classifications, in addition to the general numerical setup of frequencies, voltage levels, and preferences. This complex setup is very challenging for a new user or circuit designer, often resulting in refusal to adopt the tool and preference for manual, specifically scripted characterization suite.

SUMMARY

In one embodiment, a method for automated topology recognition and functional annotation of a mixed-signal circuit is disclosed. The method is being performed by one or more processors. The method includes extracting structural information available from the mixed-signal circuit. The method includes identifying functionality of a sub-circuit of the mixed-signal circuit based on the extracted structural information by comparing the sub-circuit with a library cell. The method includes annotating the extracted structural information with the identified functionality corresponding to the sub-circuit. The method includes automatically generating a plurality of configurations corresponding to the annotated structural information.

In another embodiment, a system for automated topology recognition and functional annotation of a mixed-signal circuit is disclosed. The system includes a memory configured to store operations and one or more processors configured to perform the operations, including extracting structural information available from the mixed-signal circuit. The operations include identifying functionality of a sub-circuit of the mixed-signal circuit based on the extracted structural information by comparing the sub-circuit with a library cell. The operations include annotating the extracted structural information with the identified functionality corresponding to the sub-circuit. The operations include automatically generating a plurality of configurations corresponding to the annotated structural information.

In yet another embodiment, a non-transitory, tangible computer-readable device having instructions stored thereon is disclosed. The instructions when executed by at least one computing device, cause the at least one computing device to perform operations for automated topology recognition and functional annotation of a mixed-signal circuit. The operations include extracting structural information available from the mixed-signal circuit. The operations include identifying functionality of a sub-circuit of the mixed-signal circuit based on the extracted structural information by comparing the sub-circuit with a library cell. The operations include annotating the extracted structural information with the identified functionality corresponding to the sub-circuit. The operations include automatically generating a plurality of configurations corresponding to the annotated structural information.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 4 illustrates an example library cell, including a differential operational transconductance amplifier (OTA) with a single input bias, in accordance with some embodiments.

Figure 1:
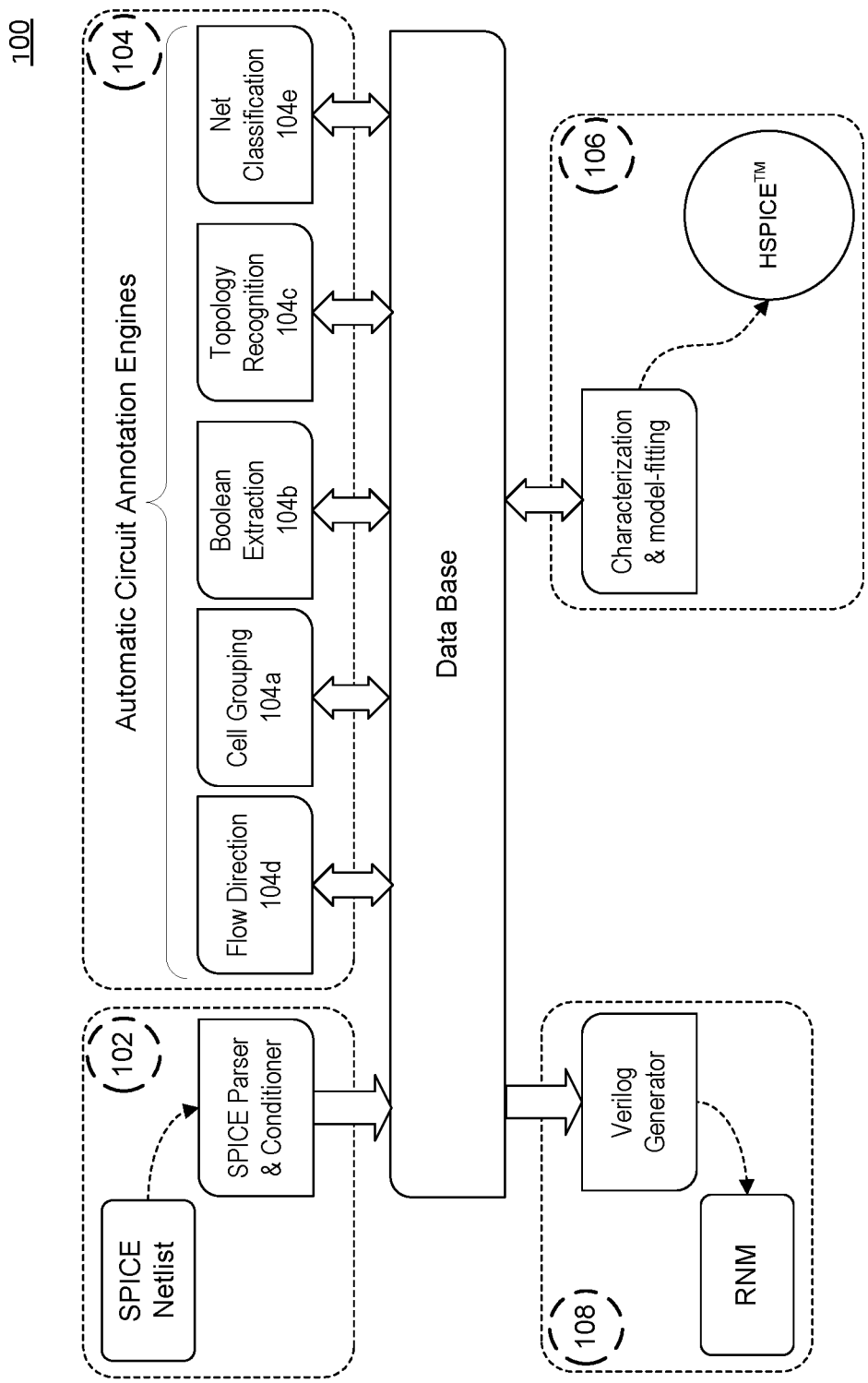
FIG. 1 illustrates a block diagram of an automatic behavioral modeling tool, in accordance with some embodiments.

To easily identify the discussion of any particular element or act, the most significant digit or digits in a reference number refer to the figure number in which that element is first introduced.

DETAILED DESCRIPTION

Aspects of the present disclosure relate to a method for automating behavioral modeling and non-spectral canonical labeling for an analog circuit of a mixed-signal circuit. The present disclosure thus describes a method for identifying the function of sub-circuits in analog and mixed-signal parts of an integrated circuit. The disclosure herein may provide an improvement in the initial generation of a tool's setup, automation, and usability. Instead of requiring the users to look up usage details in external documentation, the tool may construct configuration independently and then present the users with this work as a starting point for approval, rejection, and/or override sequence. Therefore, the learning curve may be shortened, and the tool's adoptability may be increased by increasing users' confidence in the process to receive the correct input and to be configured correctly.

Another approach to improved usability, and subsequently, adaptability, is to design the tool with maximal autonomy while keeping absolute power at the hands of the users. Such a tool would try to develop all of the configurations it needs without any user intervention. Once it used up all opportunities to annotate the design with information that is useful for automatic configuration, it presents the user with its findings and asks it to approve or reject the findings and complete the picture for the actual modeling run. This concept is based on the premise that presenting the user with an initial version of the setup (to be completed and fixed) is more user-friendly than a laconic prompt interface that requires hours of manual reading, training, and vendor-provided embedded support.

The challenge of mechanically understanding a given design arise from the minimalist SPICE format, which is only designed to list components and their connectivity, ignoring representation metadata, such as the role of pins, e.g., inputs and supplies, or Boolean function of sub-circuits. Therefore, a system that extracts structural information in a stack of topology analysis methods and generates the best possible representation of a circuit is required for eliminating the manual setup of the behavioral modeling tool.

For a mixed-signal circuit (i.e., a circuit that includes both an analog circuit and a digital logic or circuit or an analog circuit embedded in digital logic or circuit), recognition of digital logic or circuit (e.g., a complementary metal-oxide-semiconductor (CMOS) logic) in the mixed-signal circuit is typically straightforward because the digital circuits are often structured in accordance with guidelines and constraints. Contrary to that, analog circuits' structure can potentially assume any type of component connectivity. Further, the analog circuits' structure is not bound by methodology. Existing work in the field of circuit topology recognition is done for the purpose of optimizing circuits' layout rather than identifying the function of sub-circuits. Existing circuit recognition technology focuses on smaller clusters of components, mainly for optimizing their physical layout. Those methods use graph spectrum techniques to identify small building blocks, typically of 2-4 components, that need to be placed and connected. The methods using graph spectrum techniques have two disadvantages when used for identifying functional sub-circuits (e.g., differential amplifier). First, the computational complexity due to a higher number of components makes the process slow. Second, their general-purpose graph process fails to make use of circuit-specific information that is useful for improving run time and avoiding library hashing collisions.

However, several applications for analog circuit recognition require fast recognition, which in turn requires quick and discriminating labeling. Some of the available methods or tools described below have other drawbacks.

Production of representation discrete-time models for analog, mixed-signal simulation and emulation—a behavioral real-number modeling (RNM) extension of the Verilog language is already used for substituting SPICE co-simulation and accelerating verification of analog front-ends. Naïve automation of model extraction leaves too many settings for users to configure. A "no human in the loop" approach requires the modeling tool to identify and classify sub-circuits and their connectivity as much as possible.

Design review tools—a text-based "diff" leaves a deeper understanding of a design change to the reviewers, who often miss functional aspects of the reviewed change. A schematic-based presentation of well-labeled change can improve the effectiveness of peer reviews.

Design methodology enforcement—some design rules in the analog domain are communicated in human language, with minimal automatic means to check them and provide feedback. Automatic recognition of key topologies is useful for identifying design methodology violations independently of the designer's biased judgment.

FIG. 1 illustrates a block diagram of an automatic behavioral modeling tool, in accordance with some embodiments. The main building blocks of the proposed automatic behavior modeling tool 100 may be partitioned into four parts, as described below.

1. A SPICE front-end parser and topology conditioner 102, which is designed to extract structural information of an integrated circuit. The structural information may include a netlist and components of the integrated circuit. The extracted structural information may be populated in a database, and artifacts that may be confusing for topology analysis, such as parallel resistors and long-channel pairs of transistors, may be removed before storing the structural information in the database. The netlist may be provided by an integrated circuit (IC) designer or a user in any hardware description language (HDL) format for simulation of the circuit using a simulator. By way of a non-limiting example, the simulator may be performed using SPICE ("Simulation Program with Integrated Circuit Emphasis") simulation. A SPICE parser of the SPICE front-end parser and topology conditioner 102 may be used to extract structural information from a text file provided by the IC designer or the user. The SPICE front-end parser and topology conditioner 102 is described in detail using FIG. 2.

2. Automatic Circuit annotation engines 104, which are designed to add metadata to the database and work together to extract all structural information that is possible to infer from the circuit. The metadata added to the database is relevant for automatic configuration.

3. Characterization and model fitting engine 106 is a collection of tools and methods usable to plan and launch a batch of automatic analog simulations that exercise the variety of operational mode of the system. It then constructs and tunes a behavioral model to mimic the combined results of the simulations. Examples of such tools and methods would be readily appreciated by a person skilled in the relevant art. Accordingly, the characterization and model fitting engine 106 is not described in detail in the present disclosure. The characterization and model fitting engine 106 requires no-human-in-the-loop (NHIL) for this engine to perform.

4. Verilog back-end 108 expresses the generated model in simulation and emulation-supported format, in a manner readily appreciated by a person skilled in the relevant art.

Topology Conditioning Stage

Automatic topology analysis is a complicated task. There are several aspects of the topology analysis, each including more than one process. However, there are some common challenges to all analyses that can be dealt with in a preliminary processing stage. A netlist received from the IC designer or the user may contain nuances that have no topological relevance, yet add noise that challenges recognition, complicates code, and prolongs the run-time unnecessarily. Removing those challenges early on simplifies downstream code, making it smaller, more efficient, and easy to maintain. In the following section, some examples of netlist features and their modification at this stage are described.

In the mixed-signal circuit, there may be parallelly or serially connected passive components, such as resistors, capacitors, and inductors, that can be merged into a single component without changing the electric function of the netlist. Accordingly, the parallel or serially connected passive components may be pushed into a "super component" hierarchy that will be recognized by the downstream process as an atomic component. In addition, parallel long-channel or Darlington transistors may be pushed into a "super transistor" hierarchy and treated as a single transistor, e.g., an atomic component.

Figure 2:
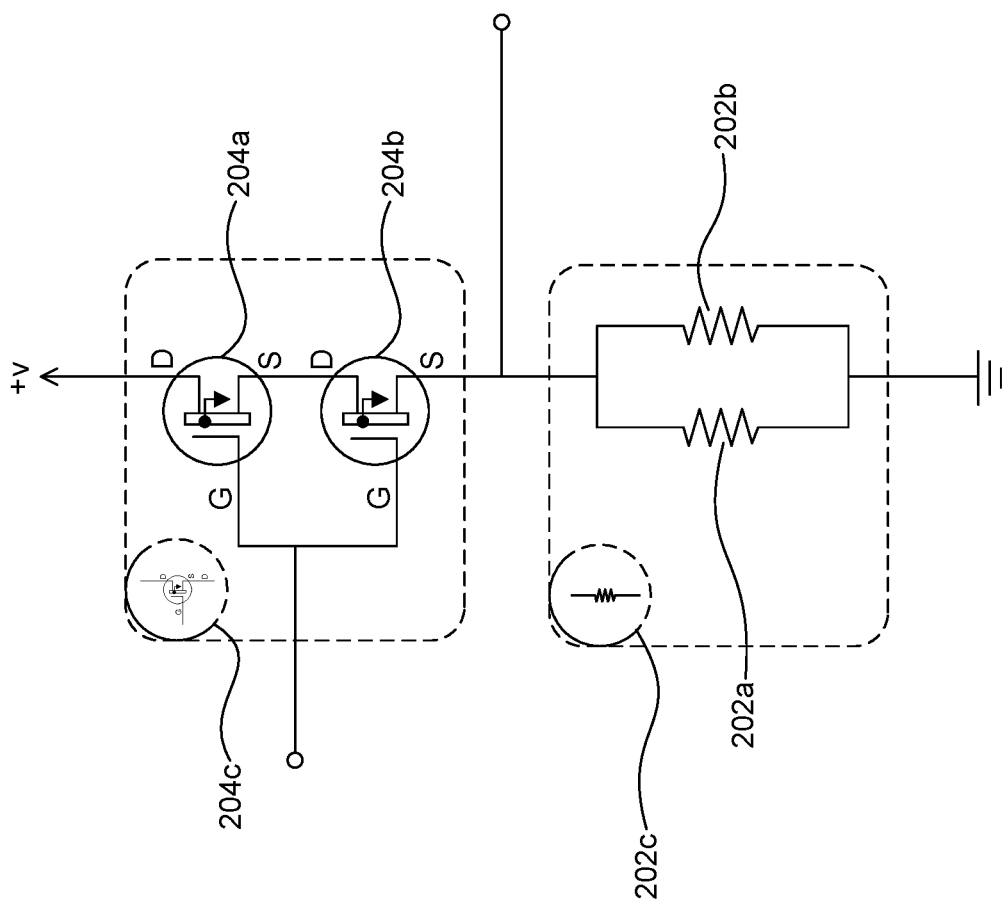
FIG. 2 illustrates a long channel positive channel metal-oxide-semiconductor (PMOS) and parallel resistors encapsulated by a conditioning stage.

FIG. 2 illustrates a long channel positive channel metal-oxide-semiconductor (PMOS) and parallel resistors encapsulated by a conditioning stage. Accordingly, FIG. 2 shows examples of atomic components. In one example, two parallelly connected resistors 202a and 202b are shown. In the second example, parallel transistors are merged into an atomic component 202c. By way of a non-limiting example, dummy transistors may be marked and later ignored by methods. Also, as shown in FIG. 2, negative metal oxide semiconductor (NMOS)/PMOS switch pairs 204a and 204b may be identified and encapsulated to help transistor grouping, as shown by 204c. During this topology conditioning stage, no changes are made to the netlist's behavior except in the hierarchy structure and new instance names. The new instance names may be used in the following methods to recognize merged components as a single component. The generated topology is populated in a database or memory.

Automatic Circuit Annotation Engine

In accordance with some embodiments, the automatic circuit annotation engine 104 may add annotating information to the topology saved in the database or memory. The automatic circuit annotation engine may use an application programming interface (API) to access the topology stored in the database or memory. In the following sections, various engines used in the method flow according to various embodiments are described in detail.

Cell Grouping

Cell grouping 104a is the first step of the annotation process that is aimed to rearrange the hierarchy of the netlist in levels that are aligned with the target Verilog hierarchy. The target Verilog hierarchy may be as described below.

1. Components—components are atomic edges in the topology graph. A component may be an original transistor, resistor, capacitor, etc., but could also be a sub-circuit, such as a super transistor, super resistor, etc., formed during the conditioning stage.
2. Cells—cell is the lowest level of a cluster of components. A cell can be recognized or classified by the engines, but it has no expression in the Verilog hierarchy.
3. Modules—A module is a collection of cells. The module level is the same as the level in the target Verilog hierarchy. The module can be either pure digital or a mixed-signal circuit. The module may be represented in the real-number modeling (RNM) language extension.
4. Top—Top is a collection of modules and represents the top-level design.

In accordance with some embodiments, cells may follow the channel-connected block (CCB) rules that specify which transistors can be grouped. In other words, components that share current are grouped, while metal-oxide-semiconductor field-effect transistor (MOSFET) gate and bipolar junction transistor (BJT) base connections cannot be grouped. By way of a non-limiting example, the same number may be used to mark same-cell components for cell grouping.

Figure 3:
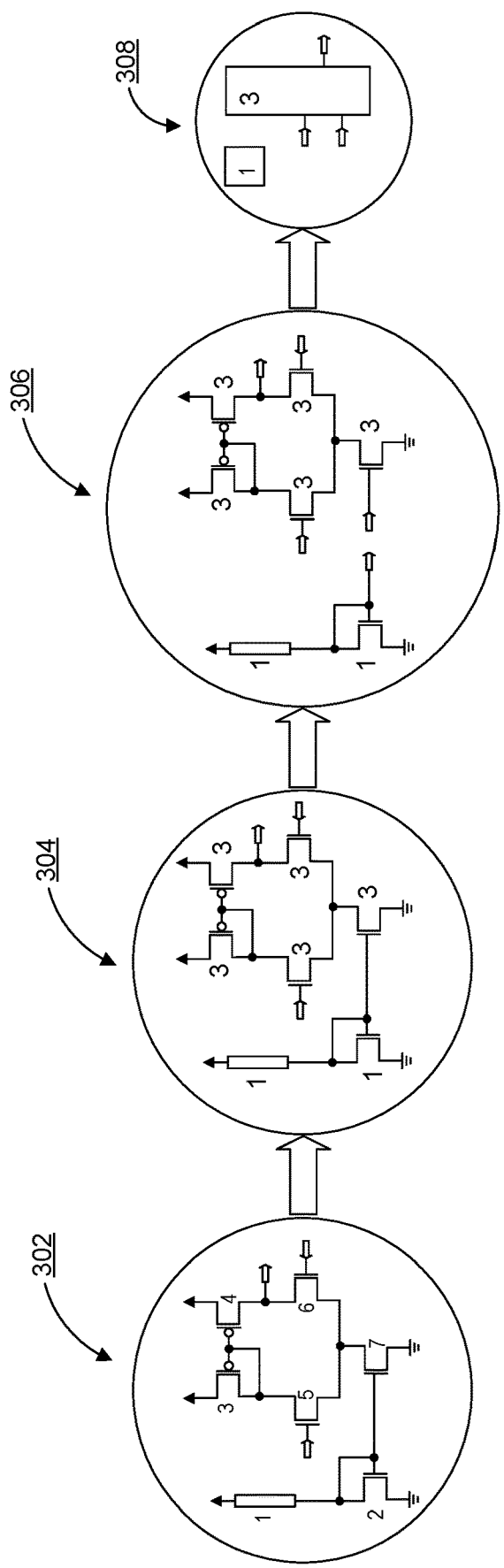
FIG. 3 illustrates a grouping of components into cells, in accordance with some embodiments.

Jumping to FIG. 3, which shows an example of the basic cell-grouping process, in accordance with some embodiments, the cell grouping process starts with a running number assigned to each component. For example, for a node 302 shown in FIG. 3, there are seven components 1 to 7. Then, repeatedly, for the node 302, the method may find the lowest number from the components that share electrical current. That number is given to all the components of the node. The process repeats the loop until the last iteration when there are no longer number changes. Accordingly, during the first iteration, the process may identify that components 1 and 2 share the electric current. Accordingly, components 1 and 2 may be numbered as 1 of the node 304, which is the same node as 302. Similarly, the process may also find that components 3 to 7 share the electric current. Accordingly, components 3 to 7 of the node 302 are each numbered as 3 in the node 304. During further iterations, the process may determine that the numbers assigned to the components no longer change, but as shown in the node 306, which is again the same node as 304 and 302, the components 1 to 7 may be reduced to two components 1 and 3, for example. After the re-numbering of the components, the surviving numbers identify the cells in the circuit. By way of a non-limiting example, for the circuit 308, which is the same as node 302, 304, or 306, there may be two cells 1 and 3. A sub-hierarchy may be introduced for each of the cells.

By way of a non-limiting example, in some embodiments, a more discriminating method may be used when cells become too large. This is often a result of having a repetitive topology connected in parallel. In this case, for each component, the labels describing the number are added with gate nets. For example, the differential pair transistors are labeled 5, inp, and 6, inn. The process may update numbers as described above and merge gate-nets to a list. After a few iterations, each component has a number and an added list of gate-driving nets. Accordingly, the OTA final label may be 3,inn,inp,bias. By way of a non-limiting example, in some embodiments, while the process may try to merge components that share current, the process may avoid merging ones that have a common driving net. This way, identical circuits that share the same inputs and same outputs are grouped separately and do not form a giant, unrecognizable cell.

Cell Classification

After cell grouping 104a, recognition of the grouped super components may be performed. Cells may be classified as digital and/or analog cells, for example. To identify non-Boolean cells, i.e., analog cells, topology recognition 104c may be used. During the topology recognition 104c, the following rules may be applied in accordance with some embodiments. Usage of resistors is not expected in most digital logic families except in register-transfer level (RTL) design, an obsolete technology, and parasitic netlist. Diodes and diode-connected transistors have no logic function and, therefore, may be commonly found in analog circuits. The non-uniform channel length is uncommon inside a single Boolean gate, which may suggest an analog circuit. The unequal number of NMOS and/or PMOS transistors is uncommon unless the logic is not CMOS. However, in some embodiments, by way of a non-limiting example, these rules may be ignored by configuration, but they are unlikely to be configured differently between two circuits of the same project.

The Boolean extraction engine 104b is described in detail below, in accordance with some embodiments. The Boolean extraction engine 104b may analyze logic gates. Analog cells can be further classified as bias generators, loads, passive, and general analog. The bias generators and loads are the cells that have no inputs and outputs, respectively. The passives are the cells that have only passive components, and the general analogs are the cells having everything else. The automatic circuit recognition engine 104 described herein in accordance with some embodiments may identify general analog cells.

Dataflow Directionality

In accordance with some embodiments, each cell's pins may be classified as inputs, outputs, supplies, and ground nets using the flow direction engine 104d. The dataflow directionality 104d process may start with the top-level connectivity of the power rails. If a reference test bench is provided, the flow direction engine 104d may use the DC voltage source as a top-level $V_{DD}$ point. By way of a non-limiting example, the user may also provide one or more starting points in a quick menu.

In accordance with some embodiments, by way of a non-limiting example, the process may use the transistors' bulk connections to identify the ground and $V_{DD}$. From the top-level, the power nets may be traced down to the cells, where the ground and supplies are annotated. Nets that do not carry power but carry data may be classified as inputs or outputs.

Inside the cell, an input connects gates, and resistors connect on the other port to inputs, and/or sub-circuits' inputs. By way of a non-limiting example, all non-inputs may be classified as outputs. In general, a connection to a transistor channel may make a pin as an output. However, there are few exceptions to this classification. Switch NMOS/PMOS pairs are directed from source to drain, and, thus, an input can be connected to a transistor's source this way. A diode connection may be an input to a current source, so when a source is shortened to the same transistor's gate, it may be exempted from the no inputs on the channels rule. By way of a non-limiting example, the dataflow directionality classification can be repeated, and some analog cell's pin directionality may be modified once recognized. Change of the analog cell's pin directionality may also affect the directionality of other nets because the sub-circuit's inputs may change as a result.

Boolean Extraction Engine

In accordance with some embodiments, Boolean extraction engine 104b may be based on dual-function methodology, in which each node in the circuit may be analyzed for a Boolean function for the following two states: $X_H$ and $X_L$ that represents a MOSFET on-path to $V_{DD}$ and MOSFET on-path to ground, respectively. $X_H$ and $X_L$ are not mutually exclusive. The conditions for the four logic levels are derived from the functions:

$X_1 = X_H$ & $!X_L$ ON transistors connect the node to $V_{DD}$ and no ON path to ground $X_0 = !X_H$ & $X_L$ ON transistors connect the node to ground and no ON path to $V_{DD}$ $X_Z = !X_H$ & $!X_L$ No ON path to either $V_{DD}$ or ground $X_X = X_H$ & $X_L$ Both $V_{DD}$ and ground have ON path to the node (contention)

In a cell that has no tri-state logic and no contention issues, an output's Boolean equation is simply its $X_1$. Some nodes, for example, latches and/or flip-flops, may exhibit circular logic, which points to data retention in latches and flip-flops. Accordingly, by way of a non-limiting example, some nodes, such as latches and/or flip-flops may be analyzed using a clock and a set/reset logic.

Cell Recognition Engine

In some embodiments, the automatic circuit automation engine 104 may include a cell recognition engine or a topology recognition engine 104c that may match a cell with a library cell as described in this disclosure below with reference to FIG. 6. The cell recognition engine may rely on a collection of pre-annotated cells that are specified using simple SPICE syntax, naming convention, and pragmas. Library cells may be listed for topology purposes, so none of the transistor's parameters needs to be specified. All the instance names can use the pound character (#) as a substitute for a unique number. Unlike parameters and instance names, meaningful names may be given to a library cell's pins for the cell recognition engine to further classify nets and correct their directionality.

By way of a non-limiting example, a pin name may have the following format: <cLass>_<in/out>[<number>]. For example, a name bias_in3 may be assigned to the third bias input of a library cell. Currently, the only pragma left supported is *>npsim, which means that the library cell can be entered twice: in its specified topology and after mirroring NMOS/PMOS and ground/$V_{DD}$ connections.

FIG. 4 illustrates an example library cell, including a differential operational transconductance amplifier (OTA) with a single input bias, using the cell recognition engine in accordance with some embodiments. The sub-circuit of a library cell 402 may be processed offline, producing two library cells, which may describe the topology of differential inputs, single output amplifiers. Because of the pound suffix in the name of the cell, the numbering of the cells in the library may be automatically generated. Any grouped cell that matches this topology may have its pins assigned the classes specified by the name of the pins in this netlist. The users may expand the cell library that is started with a collection of textbook topologies with the usage of the tool. By way of a non-limiting example, additional topologies may be provided by copying sub-circuits into the repository for identifying a cell. The compiler may be run in an offline mode as well. Accordingly, by comparing the sub-circuit with the library cell and one or more functions being performed by the library cell, functionality of the sub-circuit may also be determined. The determined functionality of the sub-circuit then may be annotated along with the structural information and stored in the repository.

Net Classification Engine

In accordance with some embodiments, the objective of the topology analysis is a classification of the top-level nets, which may be achieved using net classification engine 104e. The finer classification using the net classification engine 104e may cause more information to be available to support the auto-configuration of behavioral modeling. The net classification engine 104e may propagate cell-level net classes through the netlist and to the top level. By way of a non-limiting example, the starting point of net classification engine 104e may be a partially classified netlist. The nets that are already classified are the ones that connect directly to logic gates, bias and load cells, and library-matched analog cells. There may still be cells in the netlist that do not match with any library cell and, therefore, may be recognized as "general analog" or other such artifacts. The net classification engine may use a simple set of rules to port net classification across pass-through general analog cells and produce a top-level schema of types of nets and their direction for the user to finalize the generated top-level schema. The finalization of the top-level schema may include approval, rejection, and/or modification by the user or the IC designer.

Figure 5:
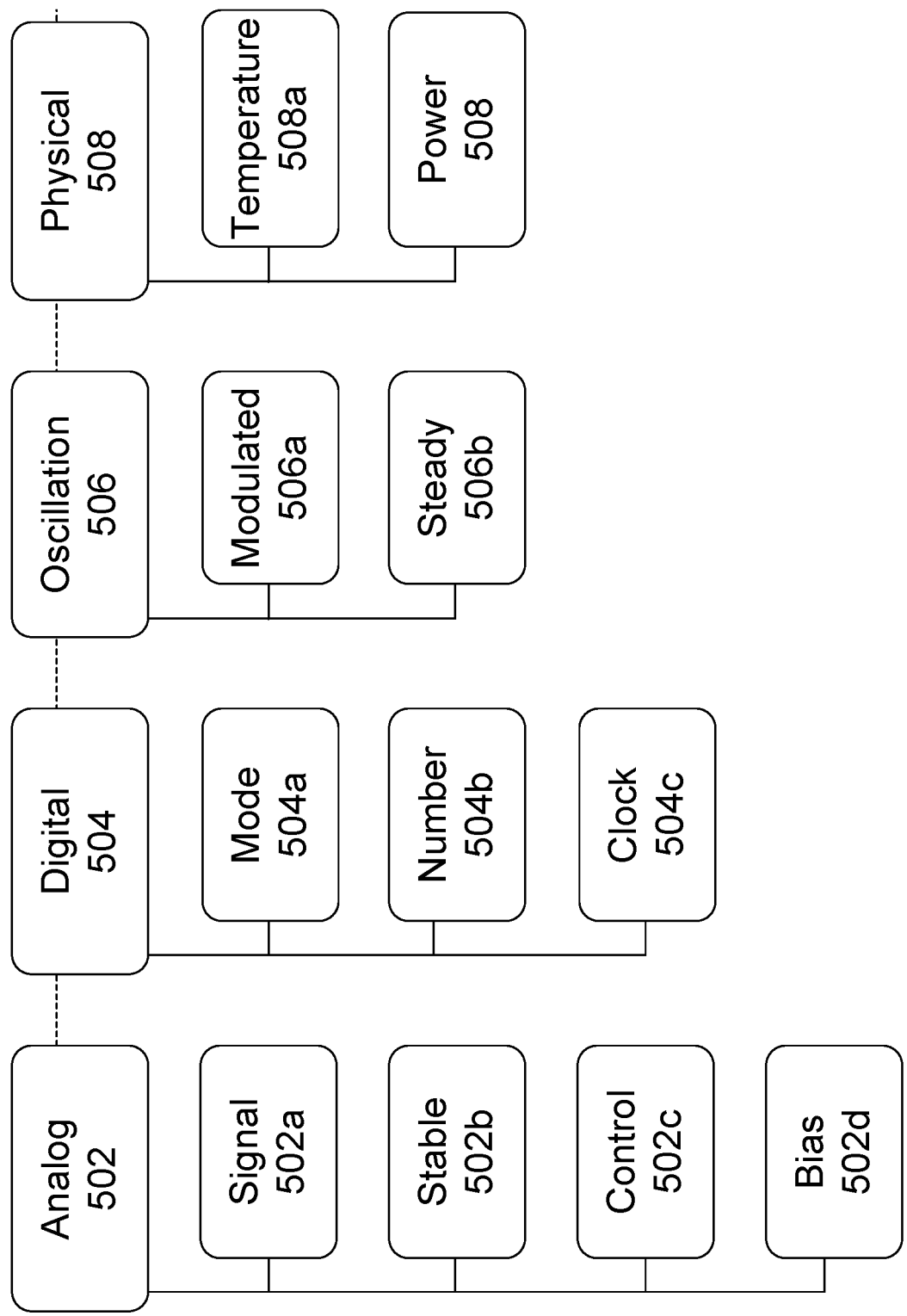
FIG. 5 illustrates a net data classification taxonomy tree in accordance with some embodiments.

As shown in FIG. 5, the initial classification of cells to analog 502 and/or digital 504 may produce the coarse classification of nets. After cells are recognized by matching them to library cells stored in the database or repository, a more detailed classification may be generated. By way of a non-limiting example, the analog cell may be further classified based on a rate of a change in a value of an analog signal. For example, a signal 502a that changes fast enough may be classified or modeled as an impulse response. A signal 502a that is classified as bias 502d may not change with time, while the signal modeled as a control 502c may change over time but not fast enough to be modeled as the impulse response. The signal 502a that does not change its value may be modeled as a stable signal 502b. In addition, oscillations 506 that carry information by the frequency and/or phase may also be classified either as modulated 506a or steady 506b. On the digital 504 side, the net classification engine 104e may automatically discern between a mode 504a and a clock 504c. By way of a non-limiting example, the user may have an option to relax the model by specifying that a Boolean input is part of a quantity represented by number 504b and not standing on its own. Accordingly, the model may be simplified, and the modeling run time may be shortened.

In accordance with some embodiments, the cell's physical characteristics 508, such as temperature 508a and power 508b may also be modeled either based on simulation or provided as an input by the IC designer or the user.

The technology described herein may also offer some potential byproducts that can be built using the parser, conditioner, annotation engines, and database of FIG. 1 as a platform. By way of a non-limiting example, the following tools may be constructed based on the disclosure herein.

1. Analog circuit ECO environment, which highlights differences between pre and post circuits to help design reviewers understand the meaning of the change.

Design style and rule enforcement, which checks that design conventions of analog design teams are observed. Because text-based inspection of a naked SPICE netlist does not reveal much, adding the annotation can help to identify violations automatically.

Analog support for transistor-level static timing analysis may be provided for the mixed-signal circuits.

Accordingly, where existing transistor-level tools rely primarily on user-provided configuration and require long training, documentation reading, and manual preparation before an initial run can be attempted, the disclosure herein saves the user both training and manual labor by attempting to self-configure before deferring to the user for complementary and higher-level input.

As stated above and described using FIG. 3, the basic cell-grouping process analyzes the analog circuits based on the circuit's topology. The cell-grouping process may be used to consolidate or integrate analog circuit components. Accordingly, the present disclosure is also related to a process for producing a label for any given circuit. The generated label is canonical, dependent only on the circuit's topology, and expressive, with a very low probability of matching another topology. This label shortens the process of circuit recognition to a direct hash lookup of a library circuit.

An effective method for identifying analog circuits beyond the common granularity required for layout (e.g., current-mirrors, matched pairs) requires curating a cell library (e.g., differential OTAs, biasing circuits) and an efficient method for matching between clusters of design components and those library cells. In accordance with some embodiments, a graph matching method may be used. The graph matching method may use a labeling scheme, which is designed to capture and express a graph's topology in a string that is indifferent to redundant information, for example, components' names, values, and netlist order, etc. Accordingly, a good labeling method as described herein in accordance with some embodiments may be based on the following priorities in descending order.

1. Canonical—indifferent to any irrelevant information.
2. Immune to collisions—produce a low probability of having two different topologies share the same label.
3. Speed—calculated quickly.

The labeling method described in this disclosure may label each net in the circuit, for example, an analog circuit, with its connected components, the type of ports that connect them, and other general graph data. The labels created for each net are then sorted and concatenated into a global circuit label. By way of a non-limiting example, abbreviations may be used to keep the per-net label and the global circuit label short. Both global and net labels may be used for looking up matching library cells, matching nets between design and library, and for machine-learned probabilistic classification of unrecognized sub-circuits.

The scope of the methods described in this form is not limited to a specific number of transistors. However, fewer than four transistors may make an "artifact" or a feature of a circuit too small to assign a significant function. This scope is typical of layout-oriented recognition and is more generally dealt with using graph spectrum methods. By way of a non-limiting example, in some embodiments, circuits larger than a couple of dozens of transistors can typically be partitioned into smaller functional blocks. Curating and recognizing topologies of such a broad scope is too application-specific and inefficient.

In accordance with some embodiments, the scope of the circuit is of a minimal sub-circuit that performs an atomic function (e.g., a core differential-pair amplifier without its biasing or output stages). Typically, a circuit of that size is a channel-connected block (CCB) or one that is defined using similar boundaries.

In the following, various topology matching methods are described in detail.

Brute-Force Topology Matching

Brute-Force Topology Matching ("Brute-Force") is the most basic method for confirming a match between two circuits. Brute-Force uses a depth-first search of the matching graph. As shown in FIG. 6, at the root of the directed graph (tree), there is a circuit 602, which has none of its transistors matching with the library circuit. An edge in the tree connects a partially matched circuit, with N matched components and to a further matching option with N+1 matched components. Further, an added component is required to be connected to the rest of the circuit in the same way it is in the library. The search may encounter dead-ends that imply an error in previous component matching. If the search reaches a vertex that has all the components that matched with the library circuit, the method stops and returns a "matched" result. On the other hand, if all vertices were visited and none of them fully matched with the library circuit, then the Brute-Force method returns an "unmatched" result.

Brute-Force method is required to be performed repeatedly on each library cell. The potentially large number of edges, at least at the beginning of the search, multiplies the time required to execute the method. In FIG. 6, the search shows a matching tree with the most apparent dead-end edges pruned. An exhaustive search, as shown in FIG. 6, can yield two possible matched permutations, which are equivalent in this case.

Reduced Circuit-Level Search Domain

Assuming, for example, that the distribution of library topologies in the designed circuits is uniform, then the Brute-Force method may require an average of T*N/2 time units to find the right topology and T*N time units for unmatched ones. Here, T represents the average time to run a depth-first search (DFS) matching. N represents the size of the library.

Brute-Force method is ignorant of information that can be used to shortcut the search directly to "unmatched" for the common case that a library circuit is not homomorphic to the circuit design under analysis.

In some embodiments, a total count of the components per each library circuit can be used to avoid matching attempts with circuits that have a different number of components. By way of a non-limiting example, a circuit that has less than six or more than six components will never match the library circuit shown in FIG. 6. This type of labeling can be used to partition the library into bins and apply the method only to the set of library cells in the appropriate one. Accordingly, the search process may be accelerated and may take t+T*n/2 time units, where t represents the added time it takes to calculate a label of a given design circuit and n<<N represents the number of library circuits per bin. Thus, the search that takes into account the number of components in the library circuit may result in the accelerated search process.

In some embodiments, similar to the number of components, other features may also be considered for further acceleration of the search process. By way of a non-limiting example, the additional features that may be considered are a combination of the total count of components and the total count of nets, breakdown of component count per type, e.g., number of resistors, number of N-type or N-channel metal-oxide-semiconductor field-effect transistors (MOSFETs), and breakdown of the component count per graph distance from the ground and type of component.

In some embodiments, by way of a non-limiting example, labeling of a library may be performed offline, but the calculation of the circuit components may be performed during run-time. Accordingly, an optimal labeling scheme as described herein in accordance with some embodiments may satisfy the following criteria: quick to extract from a given circuit and produce a single circuit per bin.

In accordance with some embodiments, by way of a non-limiting example, the metric for the first criterion may be the time complexity of the labeling method. An adequate method may visit each component once and produce a label in 0(c), where c represents the number of components in the circuit. The metric for the second criterion may be a probability of creating a hash-collision, which means a label that matches more than one library circuit.

In some embodiments, circuit-specific data rather than the general graph theory may be used for labeling the circuit. In the following sections, the tradeoff between the first and second criterion is also discussed.

Reduced Component-Level Search Domain

Matching a circuit design with a library is not enough for recognizing function. The method may be required to perform two distinct tasks: indicating whether a given library cell has the same topology as the given circuit design and mapping each component and net in the library cell to the circuit design. The second task of mapping each component and net is necessary for the identification of the type and direction of information flowing through the circuit.

Figure 6:
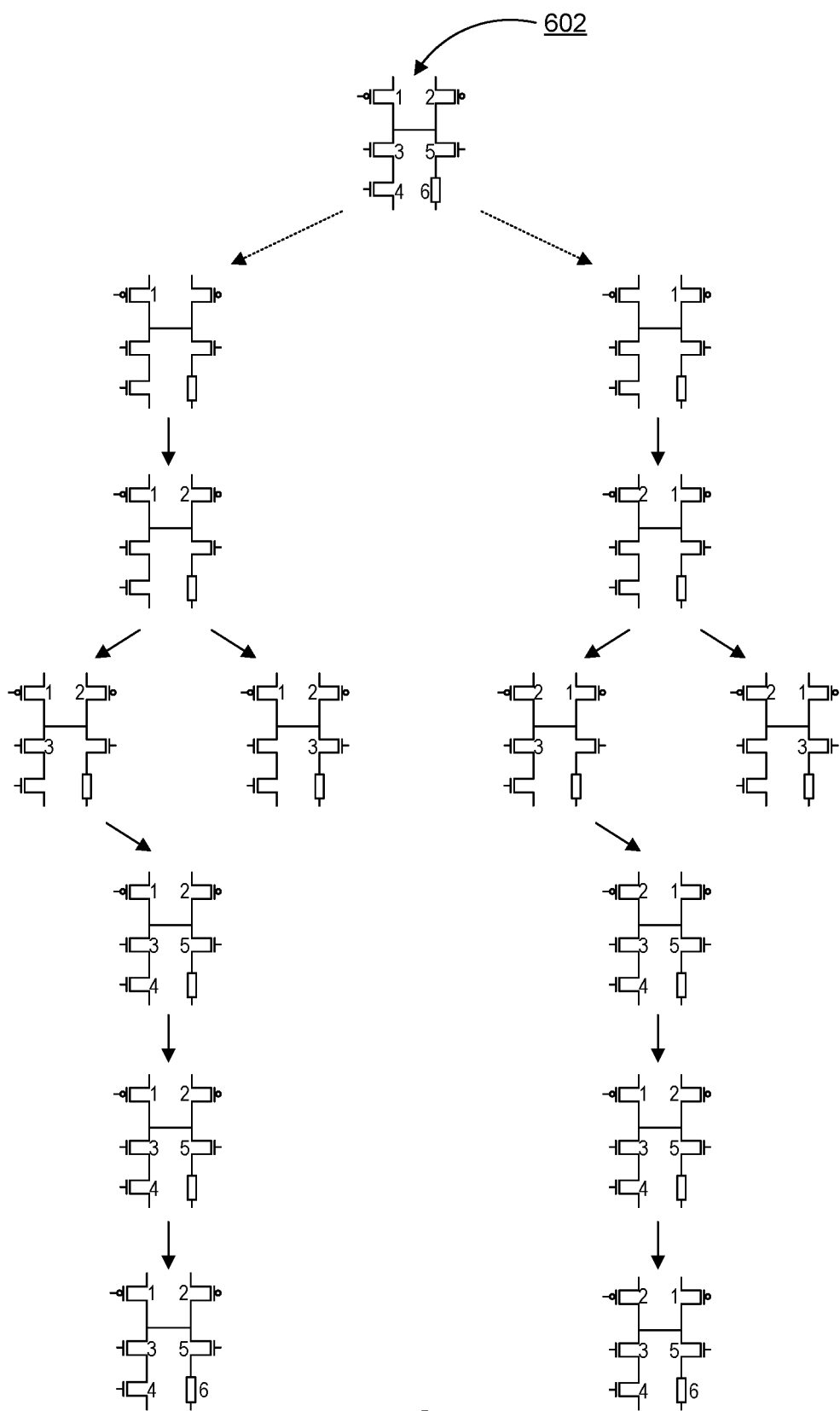
FIG. 6 illustrates a depth-first search of matching-graph designs.

As shown in FIG. 6, some of the edges in the matching tree are trivially avoidable and can be pruned a priori. For example, because transistor 1, shown in FIG. 6, is different from the negative metal oxide semiconductor (NMOS) transistor, matching transistor 1 with any of the NMOS transistors is an obvious dead-end from the start. To avoid such an obvious dead-end, inherent information of each component may be used to enhance a labeling method, as described herein, to prune the search graph further and reduce the amortized complexity of the search.

It was described above that the accelerated search process might take t+T*n/2 time units. The worst case of matching graphs, a clique, would result in O(C!), because it requires a search of all permutations of nodes. However, when a component labeling method, as described herein, is used that pairs all components directly, a simple scan of the circuit in O(C) may be enough to verify the components' connectivity. Further, the same criteria for circuit-level labeling quality may be applied to component-level labeling. Accordingly, a label generated in accordance with the embodiments described herein may be easy to calculate and unique per component. The two dead-ends in FIG. 6 may be avoided by giving each of the NMOS transistors a different label. For example, two NMOS transistors in FIG. 6 are numbered 1 and 2, respectively. Three positive channel metal-oxide-semiconductor (PMOS) transistors 3, 4, and 5 are shown in FIG. 6. The two equivalent assignments of the PMOS transistors may be reduced by labeling the transistors differently, as shown in FIG. 6 by 3 and 5, respectively.

By way of a non-limiting example, in some embodiments, the component-level label may be based on the component's type, graph distance of the component from the ground, count of neighboring components, and/or consecutive numbering of equal labels. The count of neighboring components may be further broken down based on the type of the neighboring components. The component-level labeling methods may be byproducts of the circuit-level labeling methods, and, therefore, may not require additional computation time and/or resources.

Net-Level Labeling

While components may provide useful data for differentiating between circuit topologies and, thereby, reducing the search domain, they do not express central information about topology. In other words, the connections between components may remain unknown.

In some embodiments, by way of a non-limiting example, the labeling method may be net-based, as described above with reference to the net classification engine 104e, rather than component-based. A net-based label may take the label of each component that connects to the net and adds it to the port of the connection. By way of a non-limiting example, the output net of a CMOS inverter can be labeled as NMOS_drain or PMOS_drain, while the input net may be labeled as NMOS_gate or PMOS_gate. A concatenated label may be lexicographically sorted to avoid the search for the right permutation. In the following paragraphs, an example labeling method is described in detail.

In some embodiments, the labeling method may generate a canonical label based on the circuit design. The canonical label may be independent of names, order, and/or geometry that can identify a topology-equivalent library circuit. The labeling method may have the following stages:

1. Start at the $V_{DD}$ ports. Label all connected components as $V_{DD}$ distance 0.
2. For each of the unlabeled components, find all the unlabeled components that connect to the latest N-labeled components and label them as $V_{DD}$ distance N+1.
3. Repeat the above steps 1 and 2 for ground distance labeling.
4. Merge the labels generated in step 1 or step 2 with the labels generated at step 3 to generate a single supplies-distance label. By way of a non-limiting example, ground labels may be used for the N-type MOSFET's and negative-positive-negative (NPN) bipolar junction transistors (BJTs), and $V_{DD}$ distance labels may be used for the rest.
5. For each net in the circuit, the following steps may be performed: (1) find all pins on the net; (2) list pins according to the modified base64 table that is described below—one literal per pin; (3) sort literals, for example, caba may be sorted as aabc; and (4) replace repetitive literals with Arab numeral suffix. For example, repetitive literal aaa may be represented as a3 using Arab numeral suffix, and bb may be represented as b2 similarly.
6. All net-level labels may be sorted. For example, a2bc:ades:a2bc when sorted may result into a2bc:a2bc:ades.
7. Repetitive net labels may be replaced with the Arab numeral prefix. For example, the sorted net-level label at step 6 above, when updated to replace the repetitive net-label with Arab numeral prefix, may result in 2a2bc:ades.
8. The generated and/or updated labels are saved. If the labeling is performed on a library cell, then each net-level label may be saved in a local map of the matching list of nets, and the cell-level label may be saved in a global map before exiting the method. Otherwise, the generated labels may be used to find the matching library cells. By way of a non-limiting example, if there is no library cell in the table, then this scenario indicates a new topology that may be dealt with by the user and/or probabilistic classifier. When there is a single cell in the table, then matching nets between the library and design cells may be continued, and when there are multiple cells, then the net-matching method may be used to find the specific match. The net-matching method is described below in detail.

In some embodiments, the net-matching method may be performed by finding permutations of netlabel assignments, reconstructing the library cell using the design cell connectivity, comparing a sorted and reconstructed cell to the original library cell. By way of a non-limiting example, the permutations of netlabel assignments maybe not more than four. The original library cells may be sorted. If comparison reached the end of the netlist, it is successful, and the permutation is returned. Otherwise, skip to the next permutation and repeat the reconstructing and comparing steps. If no permutation remains, then it may be concluded that this is not the matching library cell.

The table below describes the 64-bit pin-labeling literals.

| | | Supply Distance | | | | | |
|---|---|---|---|---|---|---|---|
| Device | Port | 0 | 1 | 2 | 3 | 4 | 5 |
| PFET | Drain | A | B | C | D | E | F |
| | Source | G | H | I | J | K | L |
| | Gate | M | N | O | P | Q | R |
| NFET | Drain | S | T | U | V | W | X |
| | Source | Y | Z | a | b | c | d |
| | Gate | e | f | g | h | i | j |
| Resistor | Any | k | l | | | | |
| Capacitor | Any | m | n | | | | |
| PNP | Emitter | o | p | q | | | |
| | Collector | r | s | t | | | |
| | Base | u | v | w | | | |
| NPN | Emitter | x | y | z | | | |
| | Collector | ! | @ | # | | | |
| | Base | $ | % | ^ | | | |
| Diode | Anode | & | * | | | | |
| | Cathode | ( | ) | | | | |
| Inductor | Any | - | + | | | | |

By way of a non-limiting example, in some embodiments, a component that is farther from the rails than allowed by the legend above, periods are inserted before the literal for each multiplication of the allowed steps to rails. For example, ..n is a connection to a capacitor that is 2×2+1=5 steps from $V_{DD}$.

Figure 7:
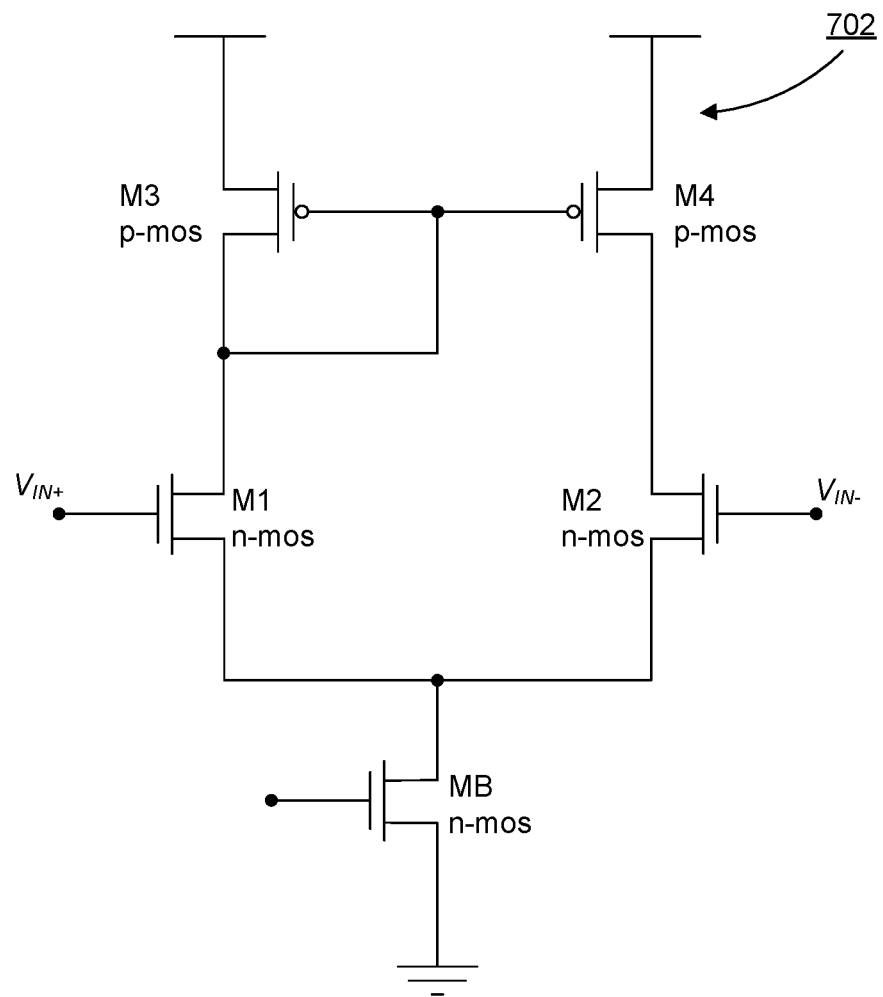
FIG. 7 illustrates a differential operation transconductance amplifier (OTA) circuit, in accordance with some embodiments.

FIG. 7 illustrates the differential operation transconductance amplifier (OTA) circuit. For this differential OTA shown in FIG. 7 as 702, the SPICE netlist may be as described below:

SPICE netlist:
.subckt diff_ota vbias vin_p vin_m vout vdd gnd
MB tail vbias gnd gnd nmos l=1u w=5u
M1 1 vin_p tail gnd nmos l=1u w=2.5u
M2 vout vin_m tail gnd nmos l=1u w=2.5u
M3 1 1 vdd vdd pmos l=1u w=2.5u
M4 vout 1 vdd vdd pmos l=1u w=2.5u
.ends For the differential OTA 702, distance from the ground is as below:
MB=0
M1, M2=1

For the differential OTA 702, distance from $V_{DD}$ is as below, and labels per net are as described in the table below:
M3, M4=0
Labels per net:

| Net | Connections | Label |
|---|---|---|
| vbias | NFET0-Gate = e | e |
| vin_m | NFET1-Gate = f | f |
| vin_p | NFET1-Gate = f | f |

| Net | Connections | | | | Label |
|---|---|---|---|---|---|
| tail | NFET0-Drain = S | NFET1-Source = Z | NFET1-Source = Z | | SZ2 |
| 1 | NFET1-Drain = T | PFET0-Drain = A | PFET0-Gate = M | PFET0-Gate = M | ATM2 |
| vout | PFET0-Drain-A | NFET1-Drain = T | | | AT |
| vdd | PFET0-Source = G | PFET0-Source = G | | | G2 |
| gnd | NFET0-Source = Y | | | | Y |

Accordingly, the cell label is AT:ATM2:G2:SZ2:Y:e:2f, and the number of net-matching permutations are 1×1×1×1×1×1×2 (=2).

Based on the labeling method, as described herein, general graph methods may be avoided, and connectivity information unique to circuits may be utilized to produce labels that are more expressive in time-linear and memory-linear complexity. Accordingly, the methods described herein may be applied to circuits of any size rather than recognizing small features of the circuits using graph spectrum-based methods. Further, the labeling methods disclosed herein may be used as a vector representation that is suitable as a basis for classification using a machine-learning method and/or neural networks. The proposed methods herein may be used for annotating nets of a circuit matched to a library circuit.

Figure 8:
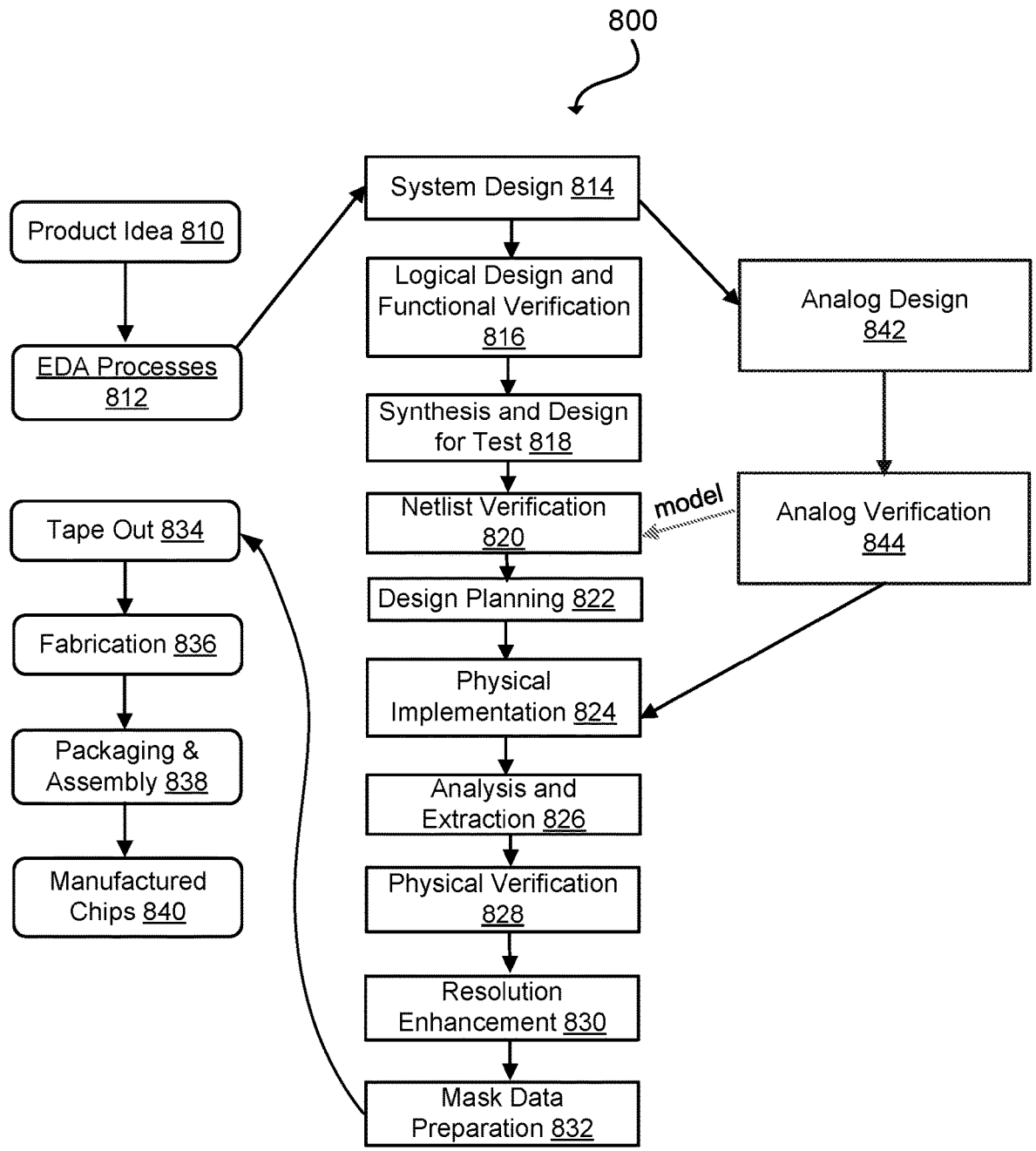
FIG. 8 illustrates a flowchart of various processes used during the design and fabrication of an integrated circuit, according to an exemplary embodiment of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information that is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836, and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 8. The processes are described by being enabled by EDA products (or tools).

During system design 814, the functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

After the system specifications are determined, the analog sub-system's specification may be derived from it and given to Analog designers, as shown by Analog Design 842. Analog designers then make decisions on the circuit's general hierarchy and choose a topology per sub-circuit. The analog designers may put together a netlist using components from a library representing the target manufacturing technology node.

In parallel to designing a circuit, the analog designers may create a test-harness and a stack of tests that exercise the design in its various specified modes and expected behavior, as shown in FIG. 8 as 844. The tests run on a component-level Analog circuit simulator, generically referred to as SPICE. After every design round, the tests indicate success or failure to meet the specifications, how far are the circuits from success (in case of failure) or a statistical prediction of how many produced circuits are likely to perform within the spec (in case of success). After verification, the designer can decide if they need to go back to design, with another topology and/or change the geometry of some components, or finally release the circuit to be physically designed. A collateral task of Analog verification 844 is the production of a behavioral model. This model can be used to verify the digital parts of the system that interface with the Analog one, substitute parts of the Analog circuit itself for faster verification tests, or provide designers upstream with an abstract representation of Analog functionality thus far.

During the logic design and functional verification 816, modules or components in the circuit are specified in one or more description languages, and the specification is checked for functional accuracy. For example, the components of the circuit may be verified to generate outputs that match the requirements of the specification of the circuit or system being designed. Functional verification may use simulators and other programs such as test bench generators, static HDL checkers, and formal verifiers. In some embodiments, special systems of components referred to as 'emulators' or 'prototyping systems' are used to speed up the functional verification.

During synthesis and design for test8, HDL code is transformed into a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for the production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for the development of cells for the library and for the physical and logical design that use the library.

Figure 9:
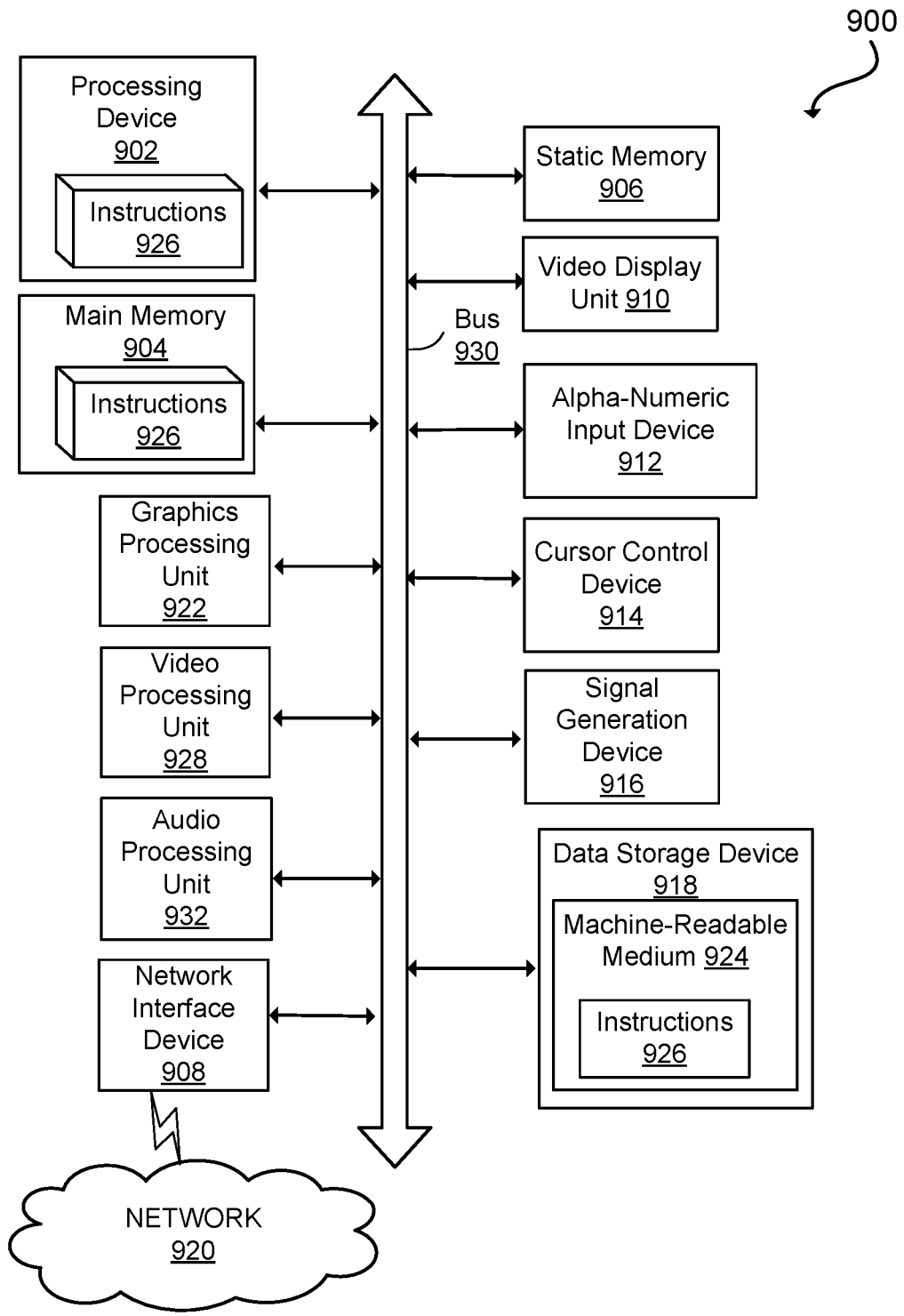
FIG. 9 illustrates a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

The processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 may also be one or more special-purpose processing devices such as an application-specific integrated circuit (ASIC), a field-programmable gate array (FPGA), a digital signal processor (DSP), network processor, or the like. The processing device 902 may be configured to execute instructions 926 for performing the operations and steps described herein.

The computer system 900 may further include a network interface device 1008 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904, and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of methods and symbolic representations of operations on data bits within a computer memory. These method descriptions and representations are the ways used by those skilled in the data processing arts to convey the substance of their work to others skilled in the art most effectively. A method may be a sequence of operations leading to the desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The methods and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure, as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed is:

1. A computer-implemented method for automated topology recognition and functional annotation of a mixed-signal circuit, the method comprising:

extracting structural information available from the mixed-signal circuit, wherein the structural information comprises a netlist and one or more components of the mixed-signal circuit;

identifying functionality of an analog sub-circuit of the mixed-signal circuit based on the extracted structural information by comparing the sub-circuit with a library cell;

annotating the extracted structural information with the identified functionality corresponding to the sub-circuit based on annotating a signal flow direction; and automatically generating a plurality of configurations corresponding to the annotated structural information, wherein each configuration of the plurality of configurations is represented in a behavior real-number model of a hardware description language (HDL).

2. The computer-implemented method of claim 1, wherein the annotating the extracted structural information further comprises generating one or more cells by grouping a plurality of components and a plurality of netlists.

3. The computer-implemented method of claim 2, wherein the plurality of components comprises one or more of a metal oxide semiconductor field effect transistors, resistors, amplifiers.

4. The computer-implemented method of claim 2, wherein the grouping of the plurality of components is performed based on electric current shared by a subset of the plurality of components.

5. The computer-implemented method of claim 2, further comprising identifying a type of the one or more cells, wherein the type of the one or more cells comprises an analog cell or a digital cell.

6. The computer-implemented method of claim 5, further comprising classifying the analog cell as a bias generator, a load, a passive, or an analog based on an input and an output of the analog cell and/or a type of each component of the analog cell.

7. The computer-implemented method of claim 5, wherein the identifying the type of the one or more cells further comprises determining a Boolean function of the digital cell.

8. The computer-implemented method of claim 5, wherein the identifying the type of the one or more cells further comprises classifying the analog cell based on a rate of a change in a value of an analog signal.

9. The computer-implemented method of claim 5, wherein the identifying the type of the one or more cells further comprises comparing the analog cell with another cell based on a number of components in the analog cell and the other cell.

10. The computer-implemented method of claim 5, wherein the identifying the type of the one or more cells further comprises labeling a plurality of connected components of the analog cell based on a distance of each component of the plurality of connected components from a power supply or a ground port of the analog cell.

11. The computer-implemented method of claim 1, wherein the annotating the extracted structural information further comprises determining a dataflow direction for a net of a plurality of nets.

12. A system for automated topology recognition and functional annotation of a mixed-signal circuit, comprising:

a memory configured to store operations; and one or more processors configured to perform the operations, the operations comprising:

extracting structural information available from the mixed-signal circuit, wherein the structural information comprises a netlist and one or more components of the mixed-signal circuit, identifying functionality of an analog sub-circuit of the mixed-signal circuit based on the extracted structural information by comparing the sub-circuit with a library cell, annotating the extracted structural information with the identified functionality corresponding to the sub-circuit based on annotating a signal flow direction, and automatically generating a plurality of configurations corresponding to the annotated structural information, wherein each configuration of the plurality of configurations is represented in a behavior real-number model of a hardware description language (HDL).

13. The system of claim 12, wherein for the annotating the extracted structural information, the operations further comprise generating one or more cells by grouping a plurality of components and a plurality of netlists, wherein the plurality of components comprises one or more of a metal oxide semiconductor field effect transistors, resistors, amplifiers.

14. The system of claim 13, wherein the grouping of the plurality of components is performed based on electric current shared by a subset of the plurality of components.

15. The system of claim 13, wherein the operations further comprise identifying a type of the one or more cells, wherein the type of the one or more cells comprises an analog cell or a digital cell.

16. The system of claim 15, wherein for the identifying the type of the one or more cells, the operations further comprise determining a Boolean function of the digital cell.

17. The system of claim 15, wherein for the identifying the type of the one or more cells, the operations further comprise comparing the analog cell with another cell based on a number of components in the analog cell and the other cell.

18. The system of claim 15, wherein for the identifying the type of the one or more cells, the operations further comprise labeling a plurality of connected components of the analog cell based on a distance of each component of the plurality of connected components from a power supply or a ground port of the analog cell.

19. The system of claim 12, wherein for the annotating the extracted structural information, the operations further comprise determining a dataflow direction for a net of a plurality of nets.

20. A non-transitory, tangible computer-readable device having instructions stored thereon that, when executed by at least one computing device, causes the at least one computing device to perform operations for automated topology recognition and functional annotation of a mixed-signal circuit, the operations comprising:

extracting structural information available from the mixed-signal circuit, wherein the structural information comprises a netlist and one or more components of the mixed-signal circuit;

identifying functionality of an analog sub-circuit of the mixed-signal circuit based on the extracted structural information by comparing the sub-circuit with a library cell;

annotating the extracted structural information with the identified functionality corresponding to the sub-circuit based on annotating a signal flow direction; and automatically generating a plurality of configurations corresponding to the annotated structural information, wherein each configuration of the plurality of configurations is represented in a behavior real-number model of a hardware description language (HDL).

* * * * *